United States Patent
Myoung

(10) Patent No.: US 11,552,607 B2
(45) Date of Patent: Jan. 10, 2023

(54) LINEAR CLASS-AB VOLTAGE TO CURRENT CONVERTER

(71) Applicant: NEWRACOM, INC., Lake Forest, CA (US)

(72) Inventor: Seong-Sik Myoung, Irvine, CA (US)

(73) Assignee: NEWRACOM, INC., Lake Forest, CA (US)

(*) Notice: Subject to any disclaimer, the term of this patent is extended or adjusted under 35 U.S.C. 154(b) by 0 days.

(21) Appl. No.: 17/567,681

(22) Filed: Jan. 3, 2022

(65) Prior Publication Data

US 2022/0216840 A1    Jul. 7, 2022

Related U.S. Application Data

(60) Provisional application No. 63/134,162, filed on Jan. 5, 2021.

(51) Int. Cl.
*H03F 3/45* (2006.01)
*H03F 1/32* (2006.01)

(52) U.S. Cl.
CPC ....... *H03F 3/45475* (2013.01); *H03F 1/3211* (2013.01); *H03F 3/45188* (2013.01); *H03F 2200/84* (2013.01)

(58) Field of Classification Search
CPC .................................................. H03F 3/45
USPC ................................................ 330/253, 257
See application file for complete search history.

(56) References Cited

U.S. PATENT DOCUMENTS

| | | | | |
|---|---|---|---|---|
| 7,119,616 | B2* | 10/2006 | Benzer | H03F 3/3022 330/252 |
| 8,653,893 | B2* | 2/2014 | Tsuchi | G09G 3/3275 330/253 |
| 2008/0024224 | A1 | 1/2008 | Blon | |
| 2009/0045876 | A1 | 2/2009 | Wang et al. | |
| 2010/0295618 | A1* | 11/2010 | Ide | H03F 3/45183 330/253 |
| 2011/0273232 | A1* | 11/2011 | Igarashi | H03F 3/45192 330/253 |
| 2016/0181983 | A1* | 6/2016 | Kiran | H03F 3/245 330/253 |
| 2017/0019074 | A1 | 1/2017 | Bokui et al. | |

OTHER PUBLICATIONS

International Search Report for PCT/US22/70049 dated May 3, 2022.

* cited by examiner

*Primary Examiner* — Henry Choe

(57) ABSTRACT

A voltage-to-current converter circuit comprises an amplifier, a resistor, first and second feedback circuits, and an output circuit. The amplifier is configured to receive a differential input voltage signal. The resistor is coupled between first and second nodes of the amplifier. The first feedback circuit is coupled to a third node of the amplifier, provides feedback to the first and second nodes when the value of the input voltage signal is in a first range, and is turned off otherwise. The second feedback circuit is coupled to a fourth node of the amplifier, provides feedback to the first and second nodes when the value of the input voltage signal is in a second range different from the first range, and is turned off otherwise. The output circuit produces a differential current output signal having a value according to the value of the input voltage signal.

9 Claims, 4 Drawing Sheets

LINEAR CLASS-AB VOLTAGE TO CURRENT CONVERTER

CROSS-REFERENCE TO RELATED APPLICATION

This application claims the benefit of U.S. Provisional Application No. 63/134,162, filed on Jan. 5, 2021, the contents of which are incorporated herein by reference.

BACKGROUND

Voltage-to-current converters produce an output current according to an input voltage. In an ideal linear voltage-to-current converter, the output current is proportional to the input voltage. Voltage-to-current converters may have differential (positive and negative) outputs, wherein the difference between a current flowing through the positive output and a current flowing through the negative output corresponds to the output current, and the output current is proportional to an input voltage. Voltage-to-current converters may have differential inputs, so that the input voltage corresponds to a difference between a voltage provided to a positive input and a voltage provided to a negative input.

In many voltage-to-current converters, the conversion is accomplished using a degeneration resistor. A voltage corresponding to the input voltage is produced across the degeneration resistor, and the resulting current flowing through the degeneration resistor is used to produce the output current.

Voltage-to-current conversion is one of the key functionalities in RF transceiver design. For example, an up-conversion mixer of an RF transmitter may comprise a voltage-to-current converter, switches, and a load for the voltage-to-current converter, and the voltage-to-current converter may play the largest part in determining the overall performance and power consumption of the up-conversion mixer. Usually, the RF transmitter chain performance is strongly dependent on the up-conversion mixer performance. Accordingly, a highly-linear and highly power-efficient voltage-to-current converter design is one of the most important part of a high performance and power efficient RF transceiver design.

Voltage-to-current converters known in the related arts may operate in class A mode, so that current flows through both the positive output and the negative output regardless of the value of the input voltage. In a class-A mode device, transistors are biased so that current flows through them at all times, regardless of whether the input voltage is negative or positive. When the input voltage is a sine wave, this means that the transistors are biased so that current flows through them during all phases of the sine wave. This increases power consumption, because the transistors must be biased to have a large enough DC quiescent current that they are guaranteed to conduct current for any level of input voltage.

Other voltage-to-current converters may operate in class AB mode, wherein for some input values, current does not flow in some transistors of the voltage-to-current converter. However, these may require the degeneration resistor (or pair of degeneration resistors when the input to the voltage-to-current converter is differential) to be driven by the previous stage. Because the practical value of the degeneration resistor(s) may be limited (for example, on-chip resistors in a semiconductor device may by practically limited to tens or hundreds of ohms), this places a high load on the stage driving the voltage-to-current converter, resulting in higher power dissipation.

Accordingly, a need exists for more power-efficient linear on-chip voltage-to-current converters.

TECHNICAL FIELD

Embodiments of the present disclosure relate to analog circuits, and in particular to linear class-AB voltage-to-current (V2I) converters that may be implemented in a semiconductor integrated circuit (e.g., a semiconductor die), and wherein a degeneration resistor is driven by a class-AB core circuit of the V2I converter.

BRIEF SUMMARY

Embodiments include voltage-to-current (V2I) converter circuits including a class-AB core circuit.

In an embodiment, a V2I converter circuit comprises a resistor, first and second constant current sources, first and second p-channel Metal-Oxide-Semiconductor Field Effect Transistors (pFETs), first, second, third, fourth, fifth, sixth, seventh, and eighth n-channel Metal-Oxide-Semiconductor Field Effect Transistor (nFET), and first and second current mirror circuits. The first constant current source is coupled to a first terminal of the resistor and configure to provide a current having a first magnitude to the first terminal of the resistor. The second constant current source is coupled to a second terminal of the resistor and configure to provide a current having the first magnitude to the second terminal of the resistor. The first pFET has a gate coupled to a positive input signal and a first conduction terminal coupled to the first terminal of the resistor. The second pFET has a gate coupled to a negative input signal and a first conduction terminal coupled to the second terminal of the resistor. The first nFET has a gate coupled to a bias voltage signal, a first conduction terminal coupled to a second conduction terminal of the first pFET, and a second conduction terminal coupled to ground. The second nFET has a gate coupled to the bias voltage signal, a first conduction terminal coupled to a second conduction terminal of the second pFET, and a second conduction terminal coupled to ground. The third nFET has a gate coupled to the first conduction terminal of the first nFET, a first conduction terminal coupled to the first terminal of the resistor, and a second conduction terminal coupled to ground. The fourth nFET has a gate coupled to the first conduction terminal of the second nFET, a first conduction terminal coupled to the second terminal of the resistor, and a second conduction terminal coupled to ground. The fifth nFET has a gate coupled to the gate of the third nFET and a second conduction terminal coupled to ground. The first current mirror circuit has a reference current input coupled to a first conduction terminal of the fifth nFET and a current output coupled to the second terminal of the resistor. The sixth nFET has a gate coupled to the gate of the third nFET and a second conduction terminal coupled to ground. The second current mirror circuit has a reference current input coupled to a first conduction terminal of the sixth nFET and a current output coupled to the first terminal of the resistor. The seventh nFET has a gate coupled to the gate of the third nFET, a first conduction terminal coupled to a positive output signal, and a second conduction terminal coupled to ground. The eighth nFET has a gate coupled to the gate of the fourth nFET, a first conduction terminal coupled to a negative output signal, and a second conduction terminal coupled to ground.

In embodiments, the V2I converter circuit further includes a first cascode stage nFET coupled between the first conduction terminal of the third nFET and the first terminal of the resistor, a second cascode stage nFET coupled between the first conduction terminal of the fourth nFET and the second terminal of the resistor, a third cascode stage nFET coupled between the first conduction terminal of the fifth nFET and the reference current input of the first current mirror circuit, and a fourth cascode stage nFET coupled between the first conduction terminal of the sixth nFET and the reference current input of the second current mirror circuit. Gates of the first, second, third, and fourth cascode stage nFETs are coupled to a cascode bias signal.

In another embodiment, a V2I converter circuit comprises a core amplifier circuit, a resistor, a first feedback circuit, a second feedback circuit, and an output circuit. The core amplifier circuit is configured to receive a differential input voltage signal, the differential input voltage signal including a first input voltage signal and a second input voltage signal, a value of the differential input voltage signal being equal to a difference between a voltage of the first input voltage signal and a voltage of the second input voltage signal. The resistor is coupled between a first node of the core amplifier circuit and a second node of the core amplifier circuit. The first feedback circuit is coupled to a third node of the core amplifier circuit and configured to provide feedback to the first node and the second node when the value of the input voltage signal is in a first range of voltages and to be turned off when the value of the input voltage signal is outside of the first range of voltages. The second feedback circuit is coupled to a fourth node of the core amplifier circuit and configured to provide feedback to the first node and the second node when the value of the input voltage signal is in a second range of voltages and to be turned off when the value of the input voltage signal is outside of the first range of voltages. The output circuit is configured to produce a differential current output signal comprising a first current output signal and a second current output signal, a value of the differential current output signal being equal to a difference between a current of the first output current signal and a current of the second output current signal, the value of the differential current output signal being determined according to the value of the input voltage signal. The first range of voltages is continuous, the second range of voltages is continuous, and a lower portion of the first range of voltages overlaps an upper portion of the second range of voltages. An upper portion of the first range of voltages does not overlap the second range of voltages, and a lower portion of the second range of voltages does not overlap the first range of voltages.

In embodiments, the first feedback circuit comprises a first feedback path coupled to the third node of the core amplifier circuit and configured to provide feedback to the first node when the value of the input voltage signal is in a first range of voltages and to be turned off when the value of the input voltage signal is outside of the first range of voltages, and a second feedback path coupled to the third node and configured to provide feedback to the second node when the value of the input voltage signal is in the first range of voltages and to be turned off when the value of the input voltage signal is outside of the first range of voltages.

In embodiments, the second feedback circuit comprises a third feedback path coupled to the fourth node of the core amplifier circuit and configured to provide feedback to the second node when the value of the input voltage signal is in a second range of voltages and to be turned off when the value of the input voltage signal is outside of the first range of voltages, and a fourth feedback path coupled to the fourth node and configured to provide feedback to the first node when the value of the input voltage signal is in the second range of voltages and to be turned off when the value of the input voltage signal is outside of the second range of voltages.

In embodiments, the V2I converter circuit further comprises a common mode feedback network having a voltage divider, a first input of the voltage divider being couple to the third node of the core amplifier circuit and second input of the voltage divider being couple to the fourth node of the core amplifier circuit, and a bias amplifier configured to generate a bias voltage signal according to an output of the voltage divider. The core amplifier circuit comprises a first constant current source configured to provide a first constant current to the first node, a second constant current source configured to provide a second constant current to the second node, the second constant current having a same magnitude as the first constant current, a first transistor having a first conduction terminal coupled to the first node, a second conduction terminal coupled to the third node, and a control terminal coupled to the first input voltage signal, a second transistor having a first conduction terminal coupled to the second node, a second conduction terminal coupled to the fourth node, and a control terminal coupled to the second input voltage signal, a third transistor having a first conduction terminal coupled to the third node, a second conduction terminal coupled to ground, and a control terminal coupled to the bias voltage signal, and a fourth transistor having a first conduction terminal coupled to the fourth node, a second conduction terminal coupled to ground, and a control terminal coupled to the bias voltage signal.

DETAILED DESCRIPTION

A detailed description of embodiments is provided below along with accompanying figures. The scope of this disclosure is limited only by the claims and encompasses numerous alternatives, modifications and equivalents. Although steps of various processes are presented in a particular order, embodiments are not necessarily limited to being performed in the listed order. In some embodiments, certain operations may be performed simultaneously, in an order other than the described order, or not performed at all.

Numerous specific details are set forth in the following description in order to provide a thorough understanding. These details are provided for the purpose of example and embodiments may be practiced according to the claims without some or all of these specific details. For the sake of clarity, technical material that is known in the technical fields related to this disclosure has not been described in detail so that the disclosure is not unnecessarily obscured.

Figure 1:
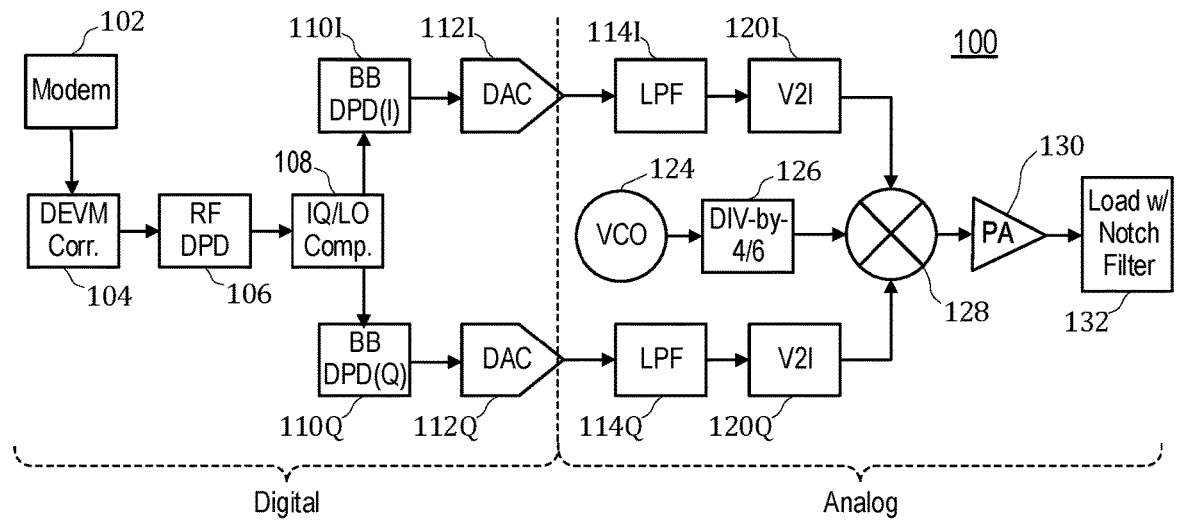
FIG. 1 illustrates a portion of a transmitter chain according to an embodiment.

FIG. 1 illustrates a portion of a transmitter chain 100 according to an embodiment. The transmitter chain includes a digital portion in which signals are primarily processed as digital signals comprising one or more bits having respective discrete values corresponding to 0 or 1, and an analog portion in which signals are primarily processed as analog signals have continuous values represented as a magnitude of a voltage or current within a continuous range.

The digital portion of the transmitter chain 100 includes a modem module 102, a Radio Frequency section (RF) Digital Pre-Distortion (DPD) module 106, a Dynamic Error Vector Magnitude (DEVM) correction module 106, an IQ mismatch/Local Oscillator leakage (IQ/LO) compensation module 108, an I-path baseband (BB) DPD module 110I, a Q-path BB DPD module 110Q, an I-path Digital-to-Analog Converter (DAC) 112I, and a Q-path Digital-to-Analog Converter (DAC) 112Q. In embodiments, the modules in the digital portion of the transmitter chain may be implemented using purpose-built electronic circuitry, field-programmable logic, processors executing computer programming instructions stored on non-transitory computer readable media, or combinations thereof, but embodiments are not limited thereto.

The analog portion of the transmitter chain 100 includes an I-path Low-Pass Filter (LPF) 114I, a Q-path LPF 114Q, an I-path voltage-to-current (V2I) converter 120I, a Q-path V2I converter 120Q, a Voltage-Controlled Oscillator (VCO) 124, a divider circuit 126, a mixer 128, a power amplifier (PA) 130, and a load circuit 132 that includes a notch filter. In embodiments, the above-listed components of the analog portion of the transmitter chain 100 are each purpose-built electronic circuitry, but embodiments are not limited thereto.

The modem 102 may produce an output signal comprising a sequence of digital values. The digital values may represent complex numbers and accordingly each digital value may include a real value (I) and a complex value (Q) each expressed as a number represented by a plurality of bits. In embodiments, the modem 102 may be a modem designed to produce signals according to a wireless standard. For example, the modem 102 may be a IEEE Std 802.11ah modem.

The DEVM correction module 104 operates to compensate for the variation in the instantaneous gain of the transmitter chain 100 that may occur due to, for example, the transmitter chain 100 experiencing a change in temperature after the transmitter chain 100 begins transmitting. The DEVM correction module 104 produces an output by applying a time-varying gain to a signal received from the modem.

In embodiments, a Crest Factor Reduction (CFR)/Spectrum Shaping Filter (SSF) module (not shown) may process the output of the modem 102 and provide the processed output to the DEVM correction module 104. The processing of the output of the modem 102 by the CFR/SSF module provides proper spectrum shaping and Error Vector Magnitude (EVM), and reduces the Peak-to-Average Power Ratio (PAPR) of the output.

The RF DPD module 106 pre-distorts the output of the DEVM correction module 104 to compensate for non-linearities in the PA 130, and in particular for variations in the gain of the PA 130 that depend on the magnitude of the signal input to the PA 130. The RF DPD module 106 may be configured to compensate for Amplitude-to-Amplitude modulation (AM2AM) nonlinearity, Amplitude-to-Phase modulation (AM2PM) nonlinearity, or both.

The IQ/LO compensation module 108 modifies the output of the RF DPD module 106 to compensate for any mismatch between the analog portion of the real (I) path and the analog portion of the imaginary (Q) path, for DC offset in the mixer 128, for leakage from the local oscillator, or combinations thereof. The real component of the output of the IQ/LO compensation module 108 is provided to the I-path BB DPD module 110I, and the imaginary component of the output of the IQ/LO compensation module 108 is provided to the Q-path BB DPD module 110Q.

The I-path BB DPD module 110I compensates for non-linearity caused by I-path baseband blocks such as the I-path LPF 114I, the I-path V2I converter 120I, and the mixer 128. The I-path BB DPD module 110I may compensate for only AM2AM distortion because the signals in the I-path are real (i.e., not complex) signals.

Similarly, the Q-path BB DPD module 110Q compensates for nonlinearity caused by Q-path baseband blocks such as the Q-path LPF 114Q, the Q-path V2I converter 120Q, and the mixer 128. The Q-path BB DPD module 110Q may compensate for only AM2AM distortion because the signals in the Q-path are real (i.e., not complex) signals.

The I-path DAC 112I converts the output of the I-path BB DPD module 110I from multi-bit digital values to corresponding analog values. The Q-path DAC 112Q converts the output of the Q-path BB DPD module 110Q from multi-bit digital values to corresponding analog values. In an illustrative embodiment, the DACs 112I and 112Q have a sampling rate $f_s$ of 32 MHz.

The I-path LPF 114I filters the output of the I-path DAC 112I. In an illustrative embodiment, the I-path LPF 114I has a selectable cut-off frequency (for example, the cut-off frequency may be configurable to be any one of a 1.5 MHz, 3 MHz, and 6 MHz) but embodiments are not limited thereto.

Similarly, the Q-path LPF 114Q filters the output of the Q-path DAC 112Q. In an illustrative embodiment, the Q-path LPF 114Q has a selectable cut-off frequency (for example, the cut-off frequency may be configurable to be any one of a 1.5 MHz, 3 MHz, and 6 MHz) but embodiments are not limited thereto.

The I-path V2I converter 120I and the Q-path V2I converter 120Q may each comprise embodiments of the present disclosure. The I-path V2I converter 120I produces an output current corresponding to an input voltage received from the I-path LPF 114I. The Q-path V2I converter 120Q produces an output current corresponding to an input voltage received from the Q-path LPF 114I.

In embodiments, the respective input voltages of the V2I converters 120I and 120Q may be received as differential signals, wherein the input voltage corresponds to a voltage difference between voltages of a pair of signals. In embodiments, the respective output currents of the V2I converters 120I and 120Q may be produced as differential signals, wherein the output current corresponds to a difference between currents of a pair of signals.

The VCO 124 produces an RF signal having a frequency according to a control voltage provided to the VCO 124. In an illustrative embodiment, the VCO 124 produces a signal having a frequency in the range of 2.56 to 3.84 GHz, according to the control voltage.

The divider circuit 126 produces a carrier signal by performing frequency division on the output of the VCO 124. In an illustrative embodiment, the ratio of the frequency division is selectable. For example, in an illustrative embodiment the divider circuit 126 may divide the output of the VCO 124 by either 4 or 6 according to a control signal provided to the divider circuit 126. Accordingly, in an illustrative embodiment wherein the VCO 124 produces a signal having a frequency in the range of 2.56 to 3.84 GHz, the divider circuit 126 may produce a carrier signal having a frequency of 426 MHZ to 640 MHz when the ratio is set to 6 and having a frequency of 640 MHZ to 960 MHz when the ratio is set to 4.

The mixer 128 combines the outputs of V2I converters 120I and 120Q and the output of the divider circuit 126 to produce a modulated RF signal.

The PA 130 amplifies the modulated RF signal and provides it to the load circuit 132. The load circuit 132 may include, for example, a tunable notch filter configured to filter out second harmonics of the modulated RF signal caused by nonlinearities in the PA 130. The load circuit 132 may further include a load transformer to perform impedance matching, provide isolation, convert the differential output signal of the PA 130 to a single-ended signal, or combinations thereof. The load circuit 132 may produce an output that may be provided to an antenna or another RF transmission medium (such as coaxial cable, stripline, twist pair cable, or the like).

Figure 2:
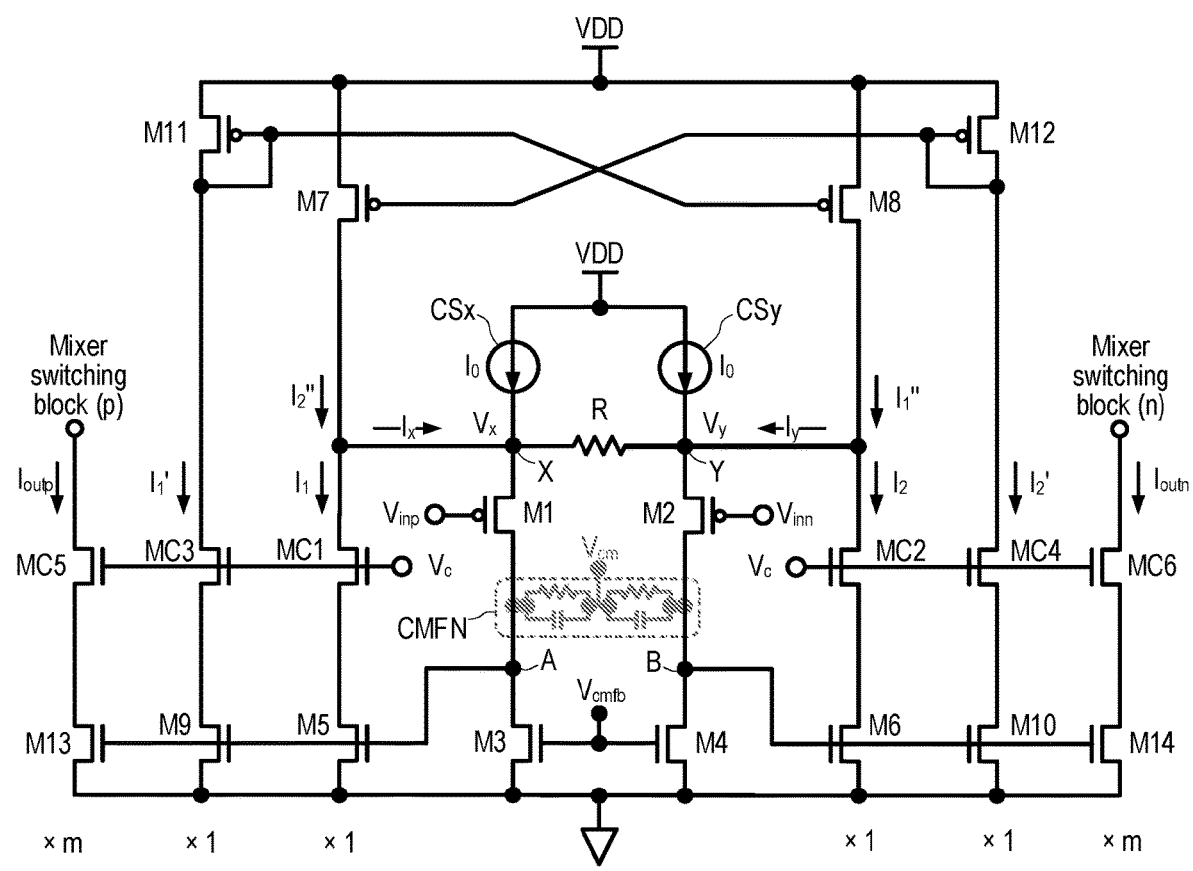
FIG. 2 illustrates a voltage-to-current (V2I) converter according to an embodiment.

FIG. 2 illustrates a voltage-to-current (V2I) converter 220 according to an embodiment. In embodiments, the V2I converters 120I and 120Q of FIG. 1 may each include a V2I converter 220.

The V2I converter 220 receives a differential voltage input comprising positive input voltage signal $V_{inp}$ and negative input voltage signal $V_{inn}$. As used with respect to a differential signal, the terms "positive signal" and "negative signal" refer to the role of the signal in the differential signal, and not to the possible values that each signal may have. The V2I converter 220 also receives a bias voltage signal $V_{cmfb}$ and a cascode stage bias voltage $V_c$.

The V2I converter 220 produces a differential current output comprising positive output current signal $I_{outp}$ and negative output current signal $I_{outn}$. The V2I converter 220 also produces an output common-mode voltage $V_{cm}$ that may be used to determine the bias voltage signal $V_{cmfb}$.

The V2I converter 220 comprises n-channel Metal-Oxide-Semiconductor Field Effect Transistors (hereinafter, nFETs) M3, M4, M5, M6, M9, M10, M13, and M14, cascode stage nFETs MC1, MC2, MC3, MC4, MC5, and MC6, and p-channel Metal-Oxide-Semiconductor Field Effect Transistors (hereinafter, pFETs) M1, M2, M7, M8, M11, and M12. Each pFET and each nFET include a control terminal (for example, a gate) and first and second conduction terminals; one of the conduction terminals may correspond to a source, and the other to a drain.

The cascode stage nFETs MC1, MC2, MC3, MC4, MC5, and MC6 improve the accuracy of the current mirror circuits that include M5, M6, M9, and M10 without sacrificing voltage headroom. In embodiments, in order to provide the best current mirror accuracy, the cascode stage nFETs MC1, MC2, MC3, and MC4 may be identical to each other, and the cascode stage nFETs MC5 and MC6 may be identical to each other and have channel widths that are m times larger than the channel widths of cascode state nFETs MC1, MC2, MC3, and MC4.

In an embodiment requiring only a low voltage headroom, the cascode stage nFETs MC1, MC2, MC3, MC4, MC5, and MC6 may be omitted (that is, replaced by a conductor connected between what used to be connected to the conduction terminals).

In embodiments, the nFETs M5, M6, M9, and M10 are identical to each other, and the channel width of each is a channel width W. The nFETs M13 and M14 are identical to the nFETs M5, M6, M9, and M10 except that they have a channel width that is m times the channel width W. Also, the pFETs M7, M8, M11, and M12 are identical to each other. In the context of this disclosure, "identical" transistors have the same electrical characteristics, which may be accomplished using one or more (and often, all) of the following techniques:

the identical transistors are the same type of transistor,
the identical transistors have the same physical dimensions such as gate thickness, gate length, gate width, et cetera,
the identical transistors are placed as close as possible in the physical design (the lay out),
the identical transistors are placed in the same gate direction in the layout,
the identical transistors experience the same semiconductor doping process. This may be accomplished by adding one or more dummy transistors in the periphery of the identical transistors in the layout, and
the identical transistors have the same electrical biasing.

The V2I converter 220 further comprises a degeneration resistor R, a common mode feedback network CMFN, and first and second constant current sources CSx and CSy. The first and second constant current sources CSx and CSy each produce a same bias current $I_0$. In an illustrative embodiment, the bias current $I_0$ is 100 microamps.

The bias current $I_0$ must be high enough that the amplifier formed by pFETs M1 and M2 and nFETs M3 and M4 is active for a whole duty cycle of an input signal having a maximum design amplitude, and so the loop gain of the feedback loop of the amplifier is high enough and the nodes X and Y are at a low impedance. Otherwise, linearity of the circuit may be degraded or a serious operation failure may occur.

The first conduction terminals of the pFETs M7, M8, M11, and M12 are coupled to a supply voltage VDD. First terminals of the constant current sources CSx and CSy are also coupled to the supply voltage VDD; in embodiments, the constant current sources CSx and CSy are implemented using MOSFETs. The second conduction terminals of the nFETs M3, M4, M5, M6, M9, M10, M13, and M13 are coupled to ground.

The first conduction terminal of nFET M3 is coupled through a node A to the gates of nFETs M5, M9, and M13, the second conduction terminal of pFET M1, and a first input of the common mode feedback network CMFN. The first conduction terminal of nFET M4 is coupled through a node B to the gates of nFETs M6, M10, and M14, the second conduction terminal of pFET M2, and a second input of the common mode feedback network CMFN.

In an embodiment, the first conduction terminals of the nFETs M5, M6, M9, M10, M13, and M13 are respectively coupled to the second conduction terminals of cascode stage nFETs MC1, MC2, MC3, MC4, MC5, and MC6. The gates of the cascode stage nFETs MC1, MC2, MC3, MC4, MC5, and MC6 are coupled to the cascode stage bias voltage $V_c$. The cascode stage bias voltage $V_c$ must be high enough to ensure that the cascode stage nFETs MC1, MC2, MC3, MC4, MC5, and MC6 are biased in the saturation region for the entire design range of the currents that may pass through them.

The first conduction terminals of the cascode stage nFETs MC5 and MC6 are respectively coupled to the positive and negative output current signals $I_{outp}$ and $I_{outn}$.

The first conduction terminals of the cascode stage nFET MC3 is coupled to the second conduction terminal of the pFET M11, the gate of the pFET M11, and the gate of the pFET M8. The first conduction terminals of the cascode stage nFET MC4 is coupled to the second conduction terminal of the pFET M12, the gate of the pFET M12, and the gate of the pFET M7.

The first conduction terminals of the cascode stage nFET MC1 is coupled to the second conduction terminal of the pFET M7, the first conduction terminal of the pFET M1, a second terminal of the first constant current source CSx, a node X, and a first terminal of the degeneration resistor R. The first conduction terminals of the cascode stage nFET MC2 is coupled to the second conduction terminal of the pFET M8, the first conduction terminal of the pFET M2, a second terminal of the second constant current source CSy, a node Y, and a second terminal of the degeneration resistor R.

The gates of the pFETs M1 and M2 are respectively coupled to the positive input voltage signal $V_{inp}$ and negative input voltage signal $V_{inn}$.

Figure 4:
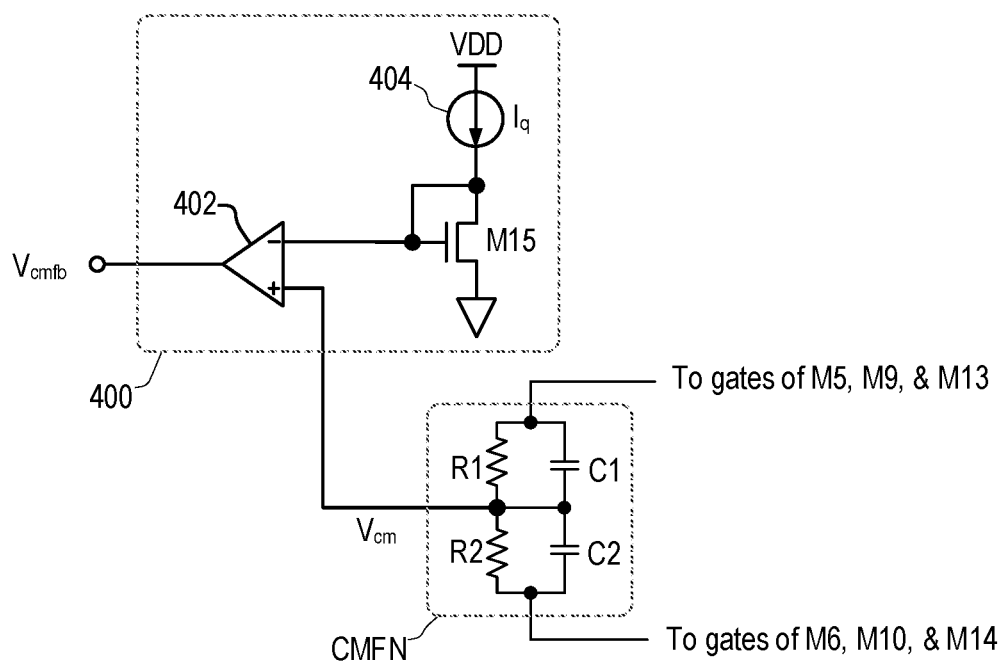
FIG. 4 illustrates a bias generation circuit according to an embodiment.

The gates of the nFETs M3 and M4 are coupled to the bias voltage signal $V_{cmfb}$. The bias voltage signal $V_{cmfb}$ is generated according to the output common-mode voltage $V_{cm}$ produced by the common mode feedback network CMFN. The bias voltage signal $V_{cmfb}$ biases the nFETs M5, M6, M9, M10, M13, and M14 according to a reference quiescent bias current $I_q$. The reference quiescent bias current $I_q$ determines the value of the differential input voltage Vin at which nFETs M5, M9, and M13 are turned on and off and the value of the differential input voltage Vin at which the nFETs M6, M10, and M14 are turned on and off; that is, when differential input voltage Vin is a sine wave, the reference quiescent bias current $I_q$ determines the conduction angle of the nFETs M5, M9, and M13 and the conduction angle of the nFETs M6, M10, and M14. FIG. 4, described below, illustrates a circuit for providing the bias voltage signal $V_{cmfb}$ according to an embodiment.

The pFETs M1 and M2 and the nFETs M3 and M4 comprise the core amplifier circuit of the V2I converter 220, and are biased to operate in saturation mode regardless of the values of the positive input voltage signal $V_{inp}$ and negative input voltage signal $V_{inn}$; for a non-limiting example, when the input voltage corresponding to the difference between the positive input voltage signal $V_{inp}$ and negative input voltage signal $V_{inn}$ is a sine wave, the pFETs M1 and M2 and the nFETs M3 and M4 operate in saturation mode for the entire duty cycle of the sine wave. The currents through the pFETs M1 and M2 and the nFETs M3 and M4 are determined by the bias current $I_0$ and the common mode feedback provided by the bias voltage $V_{cmfb}$.

The nFET M5 and the cascode stage nFET MC1 operate to provide negative feedback in the form of a current $I_1$ to node X for a first range of the input voltage. The first range consists of voltages lower than a small positive voltage value. The nFET M9, the cascode stage nFET MC3, and the pFETs M8 and M11 operate to provide negative feedback in the form of a current $I_1''$ to node Y for the first range of the input voltage. Because the nFETs M5 and M9 are the same size and have the same bias point, the nFETs M5 and M9 operate as a current mirror and a current $I_1'$ through nFET M9, cascode stage nFET MC3, and pFET M11 is equal to the current $I_1$ through the nFET M5. Because the pFETs M11 and M8 also operate as a current mirror, the absolute magnitude of the current $I_1''$ provided to the node Y is equal to the absolute magnitude of the current $I_1'$ and therefore equal to the absolute magnitude of the current $I_1$.

When the input voltage is not in the first range, the current flowing through the pFET M1 decreases causing the voltages on the gates of the nFETs M5, M9, and M13 to drop below their threshold voltages, and as a result the nFETs M5 and M9 and the pFETs M7 and M11 are turned off.

Accordingly, the nFETs M5 and M9, the cascode stage nFETs MC2 and MC4, and the pFETs M7 and M11 comprise a first feedback circuit that operates when the input voltage is in the first range.

The nFET M6 and the cascode stage nFET MC2 operate to provide negative feedback in the form of a current $I_2$ to node Y for a second range of the input voltage. The second range consists of voltages higher than a small negative voltage value. The nFET M10, the cascode stage nFET MC4, and the pFETs M7 and M12 operate to provide negative feedback to node X the form of a current $I_2''$ for the second range of the input voltage. Because the nFETs M6 and M10 operate as a current mirror and the pFETs M12 and M7 operate as a current mirror, the absolute magnitude of the current $I_2''$ is identical to the absolute magnitude of the current $I_2$.

When the input voltage is not in the second range, the nFETs M6 and M10, the cascode stage nFETs MC2 and MC4, and the pFETs M7 and M12 are turned off. In an embodiment, the second range includes values of the input voltage greater than a small negative value.

Accordingly, the nFETs M6 and M10, the cascode stage nFETs MC2 and MC4, and the pFETs M7 and M12 comprise a second feedback circuit that operates when the input voltage is in the second range.

As a result of the feedback provided to nodes X and Y, the difference between the X node voltage $V_x$ and the Y node voltage $V_y$ is equal to the difference between the positive input voltage signal $V_{inp}$ and the negative input voltage signal $V_{inn}$.

Because the nFET M9 and the cascode stage nFET MC3 operate as a current mirror that duplicates the current $I_1$ flowing through the nFET M5 and cascode stage the nFET MC1, and the nFET M10 and the cascode stage nFET MC4 operate as a current mirror that duplicates the current $I_2$ flowing through the nFET M6 and cascode stage the nFET MC2, then for a current $I_1'$ flowing through the pFET M11 and a current $I_2'$ flowing through the pFET M12:

$$I_1'=I_1 \qquad \text{Equation 1}$$

$$I_2'=I_2 \qquad \text{Equation 2}$$

Because the pFET M8 mirrors the current in the pFET M11 and the pFET M7 mirrors the current in the pFET M12, then for a current $I_1''$ flowing through the pFET M8 and a current $I_2''$ flowing through the pFET M7:

$$I_1''=I_1'=I_1 \qquad \text{Equation 3}$$

$$I_2''=I_2'=I_2 \qquad \text{Equation 4}$$

Therefore, for currents flowing $I_x$ and $I_y$ towards degeneration resistor R and a current IR flowing from node X to node Y through the degeneration resistor R $$I_x=I_2''-I_1 \text{ and } I_y=I_1''-I_2 \Rightarrow I_x=-I_y \qquad \text{Equation 5}$$

$$I_x=-I_y=(V_x-V_y)/R=(V_{inp}-V_{inn})/R \qquad \text{Equation 6}$$

$$I_{outp}=m \cdot I_1 \text{ and } I_{outn}=m \cdot I_2 \qquad \text{Equation 7}$$

and the transfer function of the V2I converter 220, where $V_{in}$ is the difference between the positive input voltage signal $V_{inp}$ and negative input voltage signal $V_{inn}$, and $I_{out}$ is the difference between the positive output current signal $I_{outp}$ and the negative output current signal $I_{outn}$, is:

$$I_{out} = I_{outp} - I_{outn} \qquad \text{Equation 8}$$
$$= m \cdot (I_1 - I_2)$$
$$= -m \cdot I_x$$
$$= -m \cdot (V_{ino} - V_{inn})/R$$
$$= -m \cdot V_{in}/R$$

Figure 3A:
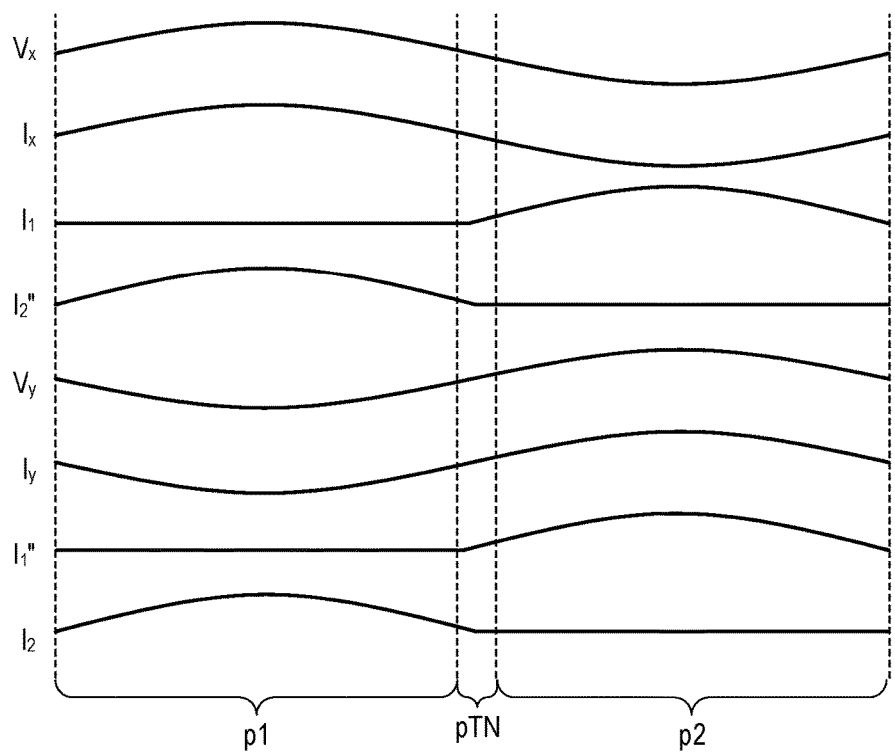
FIG. 3A shows waveforms illustrating the operation of a V2I converter according to an embodiment.
Figure 3B:
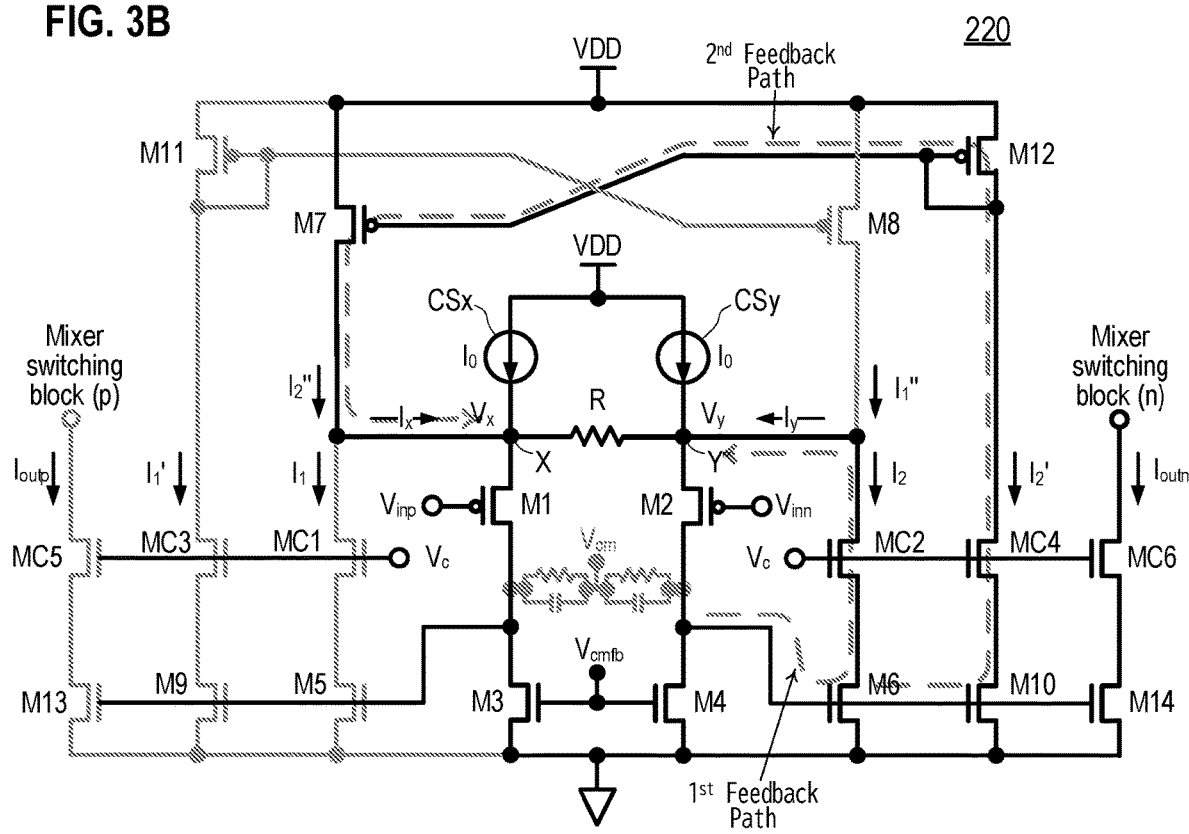
FIGS. 3B, 3C, and 3D illustrate operation of a V2I converter according to an embodiment during different respective values of an input signal.
Figure 3C:
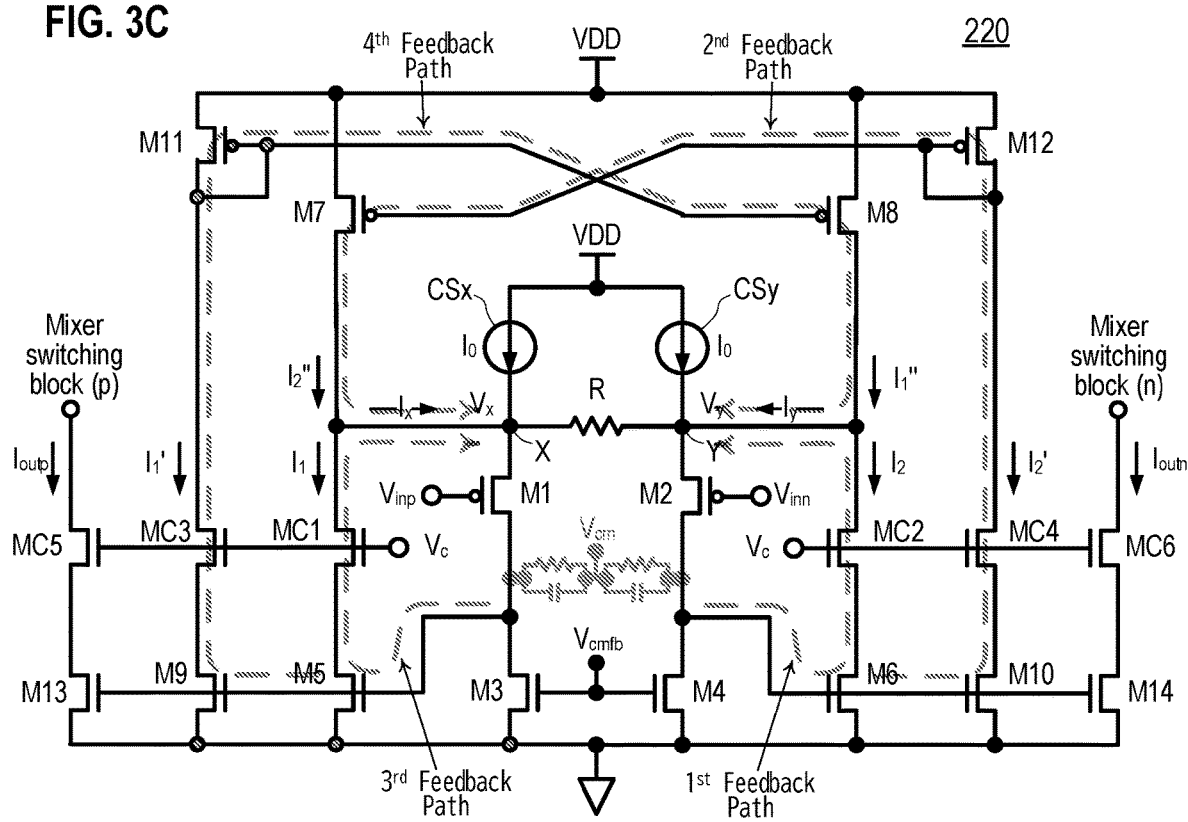
Figure 3D:
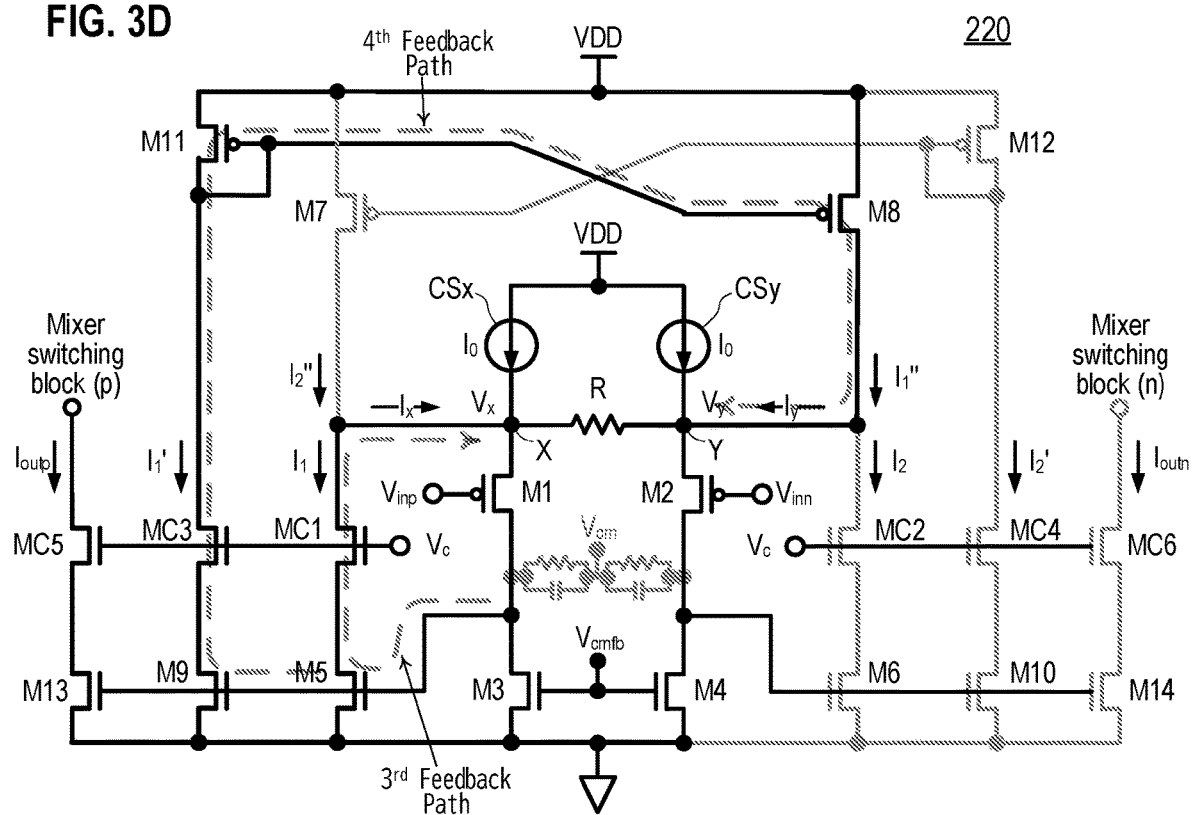

FIGS. 3A through 3E illustrate operation of the V2I converter 220 according to an embodiment. In FIGS. 3B-3D, devices and connections in which currents are flowing are represented as slightly heavier black lines, and devices and connections in which currents are not flowing are represented in gray.

FIG. 3A illustrates voltage and current waveforms of the of the V2I converter 220 during slightly less than one cycle of a sine wave input. The sine wave occurs over a first period p1 during which the values of the sine wave are positive, a transition period pTN during which the values of the sine wave transition from positive to negative, and a second period p2 during which the values of the sine wave are negative.

The waveforms include voltage values of the node X voltage $V_x$ and the node Y voltage $V_y$, and current values of the node X current $I_x$, the node Y current $I_y$, current $I_1$ through nFET M5, current $I_2''$ through pFET M7, current $I_1''$ through nFET M8, and current $I_2$ through nFET M6.

FIG. 3B illustrates operation of the V2I converter 220 during the first period p1. In the first period p1, the core amplifier circuit comprising pFETs M1 and M2 and nFETs M3 and M4 are operating in saturated mode and conducting current. A first feedback path comprising nFET M6 and cascode stage nFET MC2 is also active and provides negative feedback to node Y. A second feedback path comprising nFET M10, cascode stage nFET MC4, and pFETs M12 and M7 is also active and provides negative feedback to node X.

The nFET M14 and cascode stage nFET MC6 are also active and provide a negative output current signal $I_{outn}$ equal to m times the current $I_2$ through the nFET M6, where m is a ratio of the channel width of the nFET M14 to a channel width of the nFET M6.

The nFETs M13, M9, and M5 are all turned off, and accordingly the positive output current signal $I_{outp}$ is equal to 0.

A third feedback path comprising nFET M5 and cascode stage nFET MC1 is not active during the first period p1. A fourth feedback path comprising nFET M9, cascode stage nFET MC3, and pFETs M11 and M8 is also not active during the first period p1.

FIG. 3C illustrates operation of the V2I converter 220 during the transition period pTN. During the transition period pTN, the core amplifier circuit and all of the first, second, third and fourth feedback paths are active.

Accordingly, during the transition period pTN, the negative feedback provided to node Y is equal to the current $I_1''$ provided by the fourth feedback path minus the current $I_2$ provided by the first feedback path, and the negative feedback provided to node X is equal to the current $I_2''$ provided by the second feedback path minus the current $I_1$ provided by the third feedback path.

FIG. 3D illustrates operation of the V2I converter 220 during the second period p2. In the second period p2, the core amplifier circuit comprising pFETs M1 and M2 and nFETs M3 and M4 are operating in saturated mode and conducting current. The third feedback path comprising nFET M5 and cascode stage nFET MC1 is also active and provides negative feedback to Node X. The fourth feedback path comprising nFET M9, cascode stage nFET MC3, and pFETs M11 and M8 is also active and provides negative feedback to Node Y.

The nFET M13 and cascode stage nFET MC5 are also active and provide a positive output current signal $I_{outp}$ equal to m times the current $I_1$ through the nFET M5, where m is a ratio of the channel width of the nFET M13 to a channel width of the nFET M5.

The nFETs M14, M10, and M6 are all turned off, and accordingly the negative output current signal $I_{outn}$ is equal to 0.

The first feedback path comprising nFET M6 and cascode stage nFET MC2 and the second feedback path comprising nFET M10, cascode stage nFET MC4, and pFETs M12 and M7 are not active during the second period p2.

As shown in FIGS. 3B through 3D, for all values of the positive and negative input voltages $V_{inp}$ and $V_{inn}$, at least one feedback path is providing negative feedback to each of node X and node Y. As a result, regardless of the voltage values of the positive and negative input voltages $V_{inp}$ and $V_{inn}$, the difference between them (that is, the input voltage Vin) is always equal to the voltage across the degeneration resistor R:

$$V_{in} = (V_{inp} - V_{inn}) = (V_x - V_y) \qquad \text{Equation 9}$$

Figure 3E:
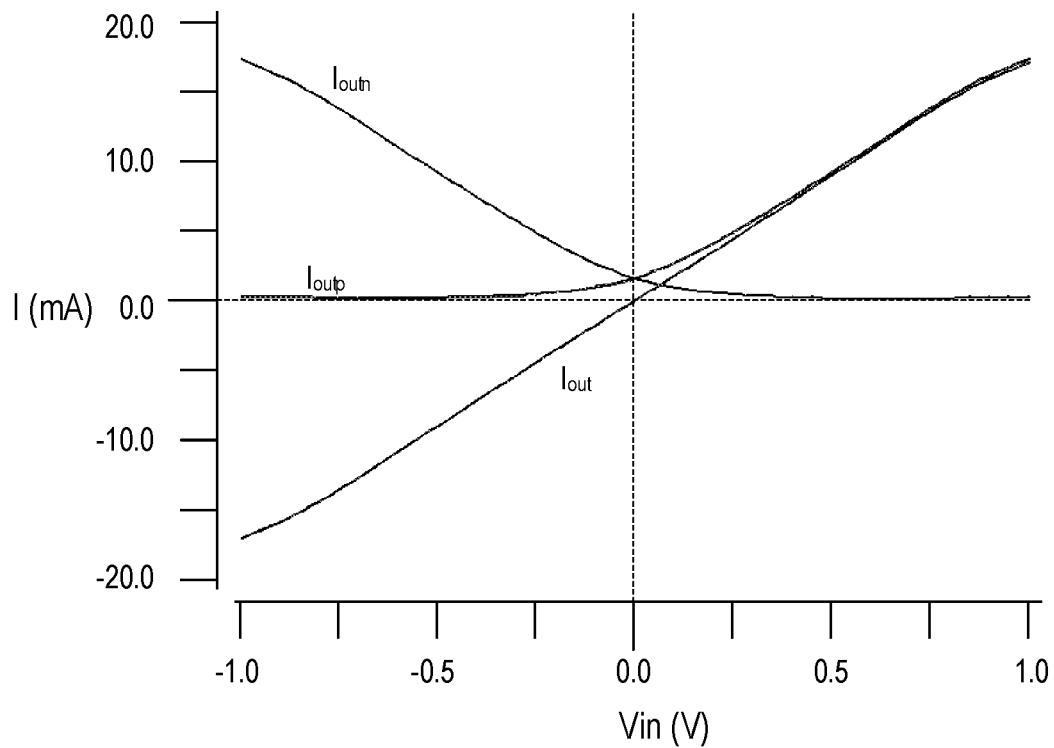
FIG. 3E illustrates transfer characteristics of a V2I converter according to an embodiment.

FIG. 3E illustrates simulation results for the V2I converter 220 according to an embodiment. In particular, FIG. 3E shows the positive output current signal $I_{outp}$, the negative output current signal $I_{outn}$ and the differential output current $I_{out}(=I_{outp}-I_{outn})$ plotted for values of the differential input voltage $V_{in}(=V_{inp}-V_{inn})$. FIG. 3E shows that because the degeneration resistor R is a passive component and the channel width ratio m is decided by physical dimensions of the pertinent transistors, the differential output current $I_{out}$ is highly linear with respect to the differential input voltage $V_{in}$.

As can also be seen in FIG. 3E, when the differential input voltage $V_{in}$ is highly negative (i.e., less than −0.3V in the illustrated example), the positive output current signal $I_{outp}$ is close to zero and the differential output current $I_{out}$ is primarily determined by the negative output current signal $I_{outn}$. In contrast, when the differential input voltage $V_{in}$ is highly positive (i.e., greater than 0.3V in the illustrated example), the negative output current signal $I_{outn}$ is close to zero and the differential output current $I_{out}$ is primarily determined by the positive output current signal $I_{outp}$. When the differential input voltage $V_{in}$ is close to zero (i.e., greater than −0.3V and less than 0.3V in the illustrated example), the differential output current $I_{out}$ is determined by both the positive output current signal $I_{outp}$ and the negative output current signal $I_{outn}$. This is a consequence of the class-AB operation of the V2I converter 220.

The class-AB operation of the V2I converter 220 allows the V2I converter 220 to be more power efficient than V2I converters of the related arts. Furthermore, the degeneration resistor R being driven by the core amplifier circuit of the V2I converter 220 (instead of by the stage driving the inputs of the V2I converter 220) also makes the V2I converter 220 more power-efficient. The reduced power consumption of the V2I converter 220 also reduces the amount of noise introduced into the outputs of the V2I converter 220 relative to V2I converters of the related arts.

FIG. 4 illustrates a bias generation circuit 400 suitable for use with an embodiment. The bias generator 400 includes a bias amplifier 402, a constant current source 404, and a reference nFET M15.

Also shown in FIG. 4 is the common mode feedback network CMFN shown in FIG. 2. The common mode feedback network CMFN shown in FIG. 4 comprises a resistor-capacitor voltage divider comprising a first resistor R1, a second resistor R2, a first capacitor C1 and a second capacitor C2, but embodiments are nor limited thereto. In embodiments, the resistances the first and second resistors R1 and R2 are equal, and the capacitances of the first and second capacitors C1 and C2 are equal. In an example embodiment, the resistance of each of the first and second resistors R1 and R2 may be 10K ohms, and the capacitance of each of the first and second capacitors C1 and C2 may be 1 picofarads.

The common mode feedback network CMFN produces an output common-mode voltage $V_{cm}$ corresponding to the average of the gate voltage on the nFET M5 of FIG. 2 and the gate voltage on the nFET M6 of FIG. 2. Accordingly, the output common-mode voltage $V_{cm}$ corresponds to the common mode voltage on the gates of nFETs M5 and M6.

The constant current source 404 provides a reference quiescent bias current $I_q$ to the reference nFET M15. The reference nFET M15 is diode-connected and is physically identical to the nFETs M5, M6, M9, and M10 except that a channel width of the reference nFET M15 may differ from the respective channel widths of the nFETs M5, M6, M9, and M10. Accordingly, a gate voltage of the reference nFET M15 will be equal to a gate voltage required to cause either of the nFETs M5 or M6 to conduct a current equal to the reference quiescent bias current $I_q$ divided by the channel width ratio CWR of the channel width of the reference nFET M15 to the channel width of nFETs M5 or M6.

The bias amplifier 402 drives the bias voltage $V_{cmfb}$ so that the average of the gate voltages on the nFETs M5 or M6 is equal to gate voltage of the reference nFET M15. Accordingly, when the differential input voltage $V_{in}$ is 0, each of the nFETs M5 and M6 will conduct current equal to the reference quiescent bias current $I_q$ divided by the channel width ratio CWR.

As the differential input voltage $V_{in}$ increases above zero, the voltage drop across the conduction terminals of the pFET M1 increases and the voltage drop across the conduction terminals of the pFET M2 decreases, so that the gate voltage of the nFET M5 decreases (eventually to near the threshold voltage of the nFET M5) and the gate voltage of the nFET M6 increases. But the average of the gate voltage of nFET M5 and the gate voltage of nFET M6 is maintained at equal to the gate voltage of M15. Similarly, as the differential input voltage $V_{in}$ decreases below zero, the voltage drop across the conduction terminals of the pFET M1 decreases and the voltage drop across the conduction terminals of the pFET M2 increases, so that the gate voltage of the nFET M5 increases and the gate voltage of the nFET M6 decreases (eventually to near the threshold voltage of the nFET M6). But the average of the gate voltage of nFET M5 and the gate voltage of nFET M6 is maintained at equal to the gate voltage of M15 by bias generation circuit 400.

The value of the differential input voltage $V_{in}$ that corresponds to the current through the nFET M5 decreasing to zero determines the conduction angle of the nFET M5. The value of the differential input voltage $V_{in}$ that corresponds to the current through the nFET M6 decreasing to zero determines the conduction angle of the nFET M6. Thus, the conduction angles of each of the nFETs M5 and M6 may be somewhat proportional to the reference quiescent bias current $I_q$ and inversely proportional to the channel width ratio CWR of the reference nFET M15 to the nFETs M5 and M6.

The circuits according to embodiments provide voltage-to-current conversion with good linearity, reduced power consumption, and reduced noise. The circuits operate in class AB, wherein a first set of subcircuits are active only for a first range of values of the input voltage, a second set of subcircuits are active only for a second range of values of the input voltage, and a third set of subcircuits are active for both ranges of values. Each of the first and second ranges of values is a continuous range. The first and second ranges of values may overlap.

Embodiments of the present disclosure include electronic devices, e.g., one or more packaged semiconductor devices, configured to perform one or more of the operations described herein. Embodiments of the present disclosure may be implemented in a single semiconductor die. However, embodiments are not limited thereto.

While this invention has been described in connection with what is presently considered to be practical embodiments, embodiments are not limited to the disclosed embodiments, but, on the contrary, may include various modifications and equivalent arrangements included within the spirit and scope of the appended claims. The order of operations described in a process is illustrative and some operations may be re-ordered. Further, two or more embodiments may be combined. The order of operations described in embodiments is illustrative and may be re-ordered unless otherwise constrained. Further, features of two or more embodiments may be combined to form a new embodiment.

What is claimed is:

1. A voltage-to-current (V2I) converter circuit, comprising:
    a resistor;
    a first constant current source coupled to a first terminal of the resistor and configure to provide a current having a first magnitude to the first terminal of the resistor;
    a second constant current source coupled to a second terminal of the resistor and configure to provide a current having the first magnitude to the second terminal of the resistor;
    a first p-channel Metal-Oxide-Semiconductor Field Effect Transistor (pFET) having a gate coupled to a positive input signal and a first conduction terminal coupled to the first terminal of the resistor;
    a second pFET having a gate coupled to a negative input signal and a first conduction terminal coupled to the second terminal of the resistor;
    a first n-channel Metal-Oxide-Semiconductor Field Effect Transistor (nFET) having a gate coupled to a bias voltage signal, a first conduction terminal coupled to a second conduction terminal of the first pFET, and a second conduction terminal coupled to ground;
    a second nFET having a gate coupled to the bias voltage signal, a first conduction terminal coupled to a second conduction terminal of the second pFET, and a second conduction terminal coupled to ground;
    a third nFET having a gate coupled to the first conduction terminal of the first nFET, a first conduction terminal coupled to the first terminal of the resistor, and a second conduction terminal coupled to ground;
    a fourth nFET having a gate coupled to the first conduction terminal of the second nFET, a first conduction terminal coupled to the second terminal of the resistor, and a second conduction terminal coupled to ground;

a fifth nFET having a gate coupled to the gate of the third nFET and a second conduction terminal coupled to ground;

a first current mirror circuit having a reference current input coupled to a first conduction terminal of the fifth nFET and a current output coupled to the second terminal of the resistor;

a sixth nFET having a gate coupled to the gate of the third nFET and a second conduction terminal coupled to ground;

a second current mirror circuit having a reference current input coupled to a first conduction terminal of the sixth nFET and a current output coupled to the first terminal of the resistor;

a seventh nFET having a gate coupled to the gate of the third nFET, a first conduction terminal coupled to a positive output signal, and a second conduction terminal coupled to ground; and an eighth nFET having a gate coupled to the gate of the fourth nFET, a first conduction terminal coupled to a negative output signal, and a second conduction terminal coupled to ground.

2. The V2I converter circuit of claim 1, further comprising:

a first cascode stage nFET coupled between the first conduction terminal of the third nFET and the first terminal of the resistor;

a second cascode stage nFET coupled between the first conduction terminal of the fourth nFET and the second terminal of the resistor;

a third cascode stage nFET coupled between the first conduction terminal of the fifth nFET and the reference current input of the first current mirror circuit;

a fourth cascode stage nFET coupled between the first conduction terminal of the sixth nFET and the reference current input of the second current mirror circuit, wherein gates of the first, second, third, and fourth cascode stage nFETs are coupled to a cascode bias signal.

3. The V2I converter circuit of claim 1, further comprising:

a fifth cascode stage nFET coupled between the first conduction terminal of the seventh nFET and the positive output signal;

a sixth cascode stage nFET coupled between the first conduction terminal of the eighth nFET and the negative output signal, wherein gates of the fifth and sixth cascode stage nFETs are coupled to a cascode bias signal.

4. The V2I converter circuit of claim 1, wherein the fourth, fifth, and sixth nFETs are identical to the third nFET.

5. The V2I converter circuit of claim 1, wherein the seventh and eighth nFETs are identical to the third nFET except that a channel width of each of the seventh and eighth nFETs is a multiple of the channel width of the third nFET.

6. The V2I converter circuit of claim 1,
wherein the first current mirror circuit comprises:
a fifth pFET having a second conduction terminal and a gate both coupled to the reference current input of the first current mirror circuit and a first conduction terminal couple to a supply voltage, and
a fourth pFET having a first conduction terminal couple to the supply voltage, a second conduction terminal coupled to the current output of the first current mirror circuit, and a gate couple to the gate of the fifth pFET, wherein the fourth pFET is identical to the fifth pFET;

wherein the second current mirror circuit comprises:
a sixth pFET having a second conduction terminal and a gate both coupled to the reference current input of the second current mirror circuit and a first conduction terminal couple to a supply voltage, and
a third pFET having a first conduction terminal couple to the supply voltage, a second conduction terminal coupled to the current output of the second current mirror circuit, and a gate couple to the gate of the sixth pFET, wherein the third pFET is identical to the sixth pFET.

7. The V2I converter circuit of claim 1, further comprising:

a common mode feedback network including a voltage divider having a first input coupled to the first conduction terminal of the first nFET and a second input coupled to the second conduction terminal of the first nFET; and a bias generation circuit configured to produce the bias voltage signal according to an output voltage of the common mode feedback network and a reference quiescent bias current.

8. The V2I converter circuit of claim 7, wherein the bias generation circuit comprises:

a reference nFET having a second conduction terminal coupled to ground, wherein the reference nFET is identical to the third nFET except that a channel width of the reference nFET is a multiple of the channel width of the third nFET;

a constant current source having a current output coupled to a first conduction terminal of the reference nFET and to a gate of the reference nFET, the constant current source configured to produce the reference quiescent bias current on the current output;

a differential amplifier having a positive input coupled to an output of the common mode feedback network, a negative input coupled to the gate of the reference nFET, and an output coupled to the bias voltage signal.

9. The V2I converter circuit of claim 7, wherein the voltage divider of the common mode feedback network comprises:

a first resistor coupled between the first input of the voltage divider and the output of the common mode feedback network;

a second resistor coupled between the second input of the voltage divider and the output of the common mode feedback network, the second resistor having a same resistance as the first resistor;

a first capacitor coupled between the first input of the voltage divider and the output of the common mode feedback network; and a second capacitor coupled between the second input of the voltage divider and the output of the common mode feedback network, the second capacitor having a same capacitance as the first capacitor.

\* \* \* \* \*